United States Patent
Chen et al.

(10) Patent No.: US 6,509,247 B2
(45) Date of Patent: *Jan. 21, 2003

(54) SEMICONDUCTOR DEVICE AND ALIGNMENT METHOD

(75) Inventors: Gong Chen, Gilbert, AZ (US); Robert D. Colclasure, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/769,710

(22) Filed: Jan. 25, 2001

(65) Prior Publication Data

US 2001/0008790 A1 Jul. 19, 2001

Related U.S. Application Data

(63) Continuation of application No. 09/072,052, filed on May 4, 1998, now Pat. No. 6,228,743.

(51) Int. Cl.[7] ................................................ H01L 21/76
(52) U.S. Cl. ................ 438/401; 438/462; 438/946; 438/975
(58) Field of Search ................................ 438/401, 462, 438/946, 975; 257/797

(56) References Cited

U.S. PATENT DOCUMENTS

| | | | |
|---|---|---|---|
| 4,103,998 A | 8/1978 | Nakazawa et al. | 356/152 |
| 4,423,127 A | 12/1983 | Fujimura | |
| 4,620,785 A | 11/1986 | Suzuki et al. | |
| 4,849,313 A | 7/1989 | Chapman et al. | |
| 5,716,889 A | 2/1998 | Tsuji et al. | 438/401 |
| 5,910,830 A | 6/1999 | Nam | 349/158 |
| 5,943,587 A | 8/1999 | Batterson et al. | 438/401 |
| 5,952,135 A | 9/1999 | Ghandehari et al. | 430/22 |
| 5,952,694 A | 9/1999 | Miyawaki et al. | 257/347 |
| 6,002,182 A | 12/1999 | Madurawe | 257/797 |
| 6,228,743 B1 * | 5/2001 | Chen et al. | 438/401 |

FOREIGN PATENT DOCUMENTS

| | | |
|---|---|---|
| EP | 0 389 209 | 9/1990 |
| JP | 62060223 | 3/1987 |
| WO | 86/04158 | 7/1986 |

* cited by examiner

Primary Examiner—Eddie Lee
Assistant Examiner—N. Drew Richards
(74) Attorney, Agent, or Firm—Robert F. Hightower; Kim-Marie Vo

(57) ABSTRACT

A semiconductor wafer (101) includes a first semiconductor die (103) having a first alignment mark (165) disposed in an alignment region (163) to align the first semiconductor die on the wafer. A second semiconductor die (181) has a second alignment mark (167) disposed in the alignment region such that the second alignment mark overlaps the first alignment mark. The area occupied by the overlapping alignment marks is shared between the first and second semiconductor dice to reduce the area and the cost of each die.

9 Claims, 1 Drawing Sheet

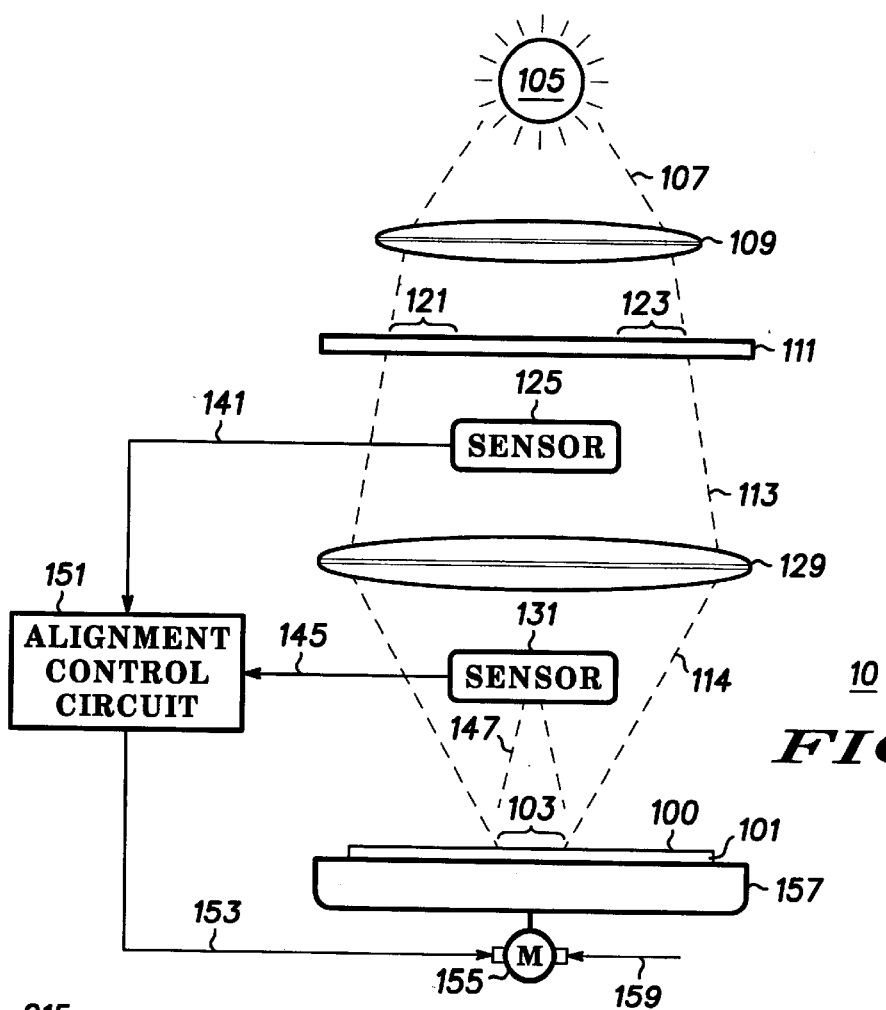
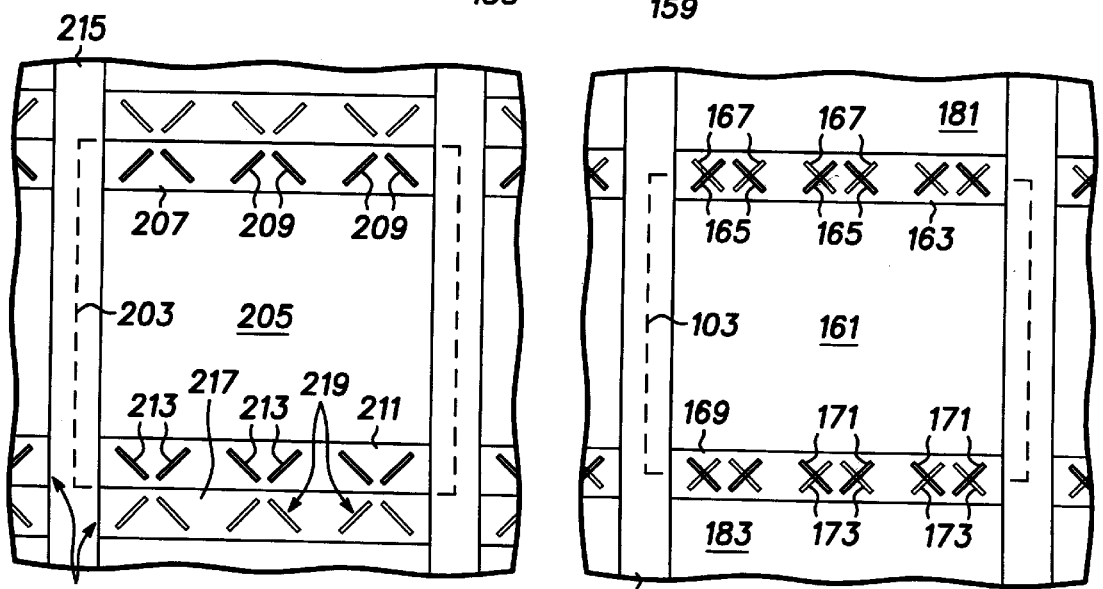

SEMICONDUCTOR DEVICE AND ALIGNMENT METHOD

This is a continuation of Ser. No. 09/072,052 filed May 4, 1998, now U.S. Pat. No. 6,228,743.

BACKGROUND OF THE INVENTION

The present invention relates in general to semiconductors, and more particularly to aligning a semiconductor die on a semiconductor wafer.

Semiconductor devices typically are fabricated as an array of dice formed on a semiconductor wafer. The devices are built up in successive layers of material formed into predetermined patterns. Patterns typically are produced by coating the wafer with a photoresist and activating a light path directed through a reticle functioning as a photomask. An alignment tool is used to align the wafer and reticle by locating an alignment mark on the reticle and one formed on the wafer during a previous processing step. Such alignment marks occupy regions of the wafer surface and can add significantly to the size of a semiconductor die. To minimize the increase in die size, many systems place alignment marks in inactive regions of the die such as scribe grids where there is no active circuitry.

Modern alignment tools electronically align a photomask to a wafer by locating alignment marks with optical sensors. The wafer and photomask positions are determined from the alignment marks and are adjusted by controlling the position of a wafer stage with a stepper motor and a feedback signal. Prior art alignment tools use multiple sets of alignment marks to improve sensing and alignment resolution. The multiple sets of alignment marks improve alignment but occupy a large die area that increases the cost of a semiconductor device.

Hence, there is a need for a semiconductor device aligned with a system that can reduce the die area and resulting manufacturing cost of the semiconductor device.

BRIEF DESCRIPTION OF THE DRAWINGS

FIG. 1 schematically illustrates a stepper alignment tool for aligning a reticle to a semiconductor wafer in accordance with the present invention;

FIG. 2 illustrates a prior art semiconductor wafer showing a set of prior art alignment marks; and FIG. 3 illustrates a semiconductor wafer showing a set of alignment marks in accordance with the present invention.

DETAILED DESCRIPTION OF THE DRAWINGS

In the figures, elements having the same reference number have similar functionality.

FIG. 1 schematically illustrates a stepper alignment tool 10 that exposes a photoresist coated surface 100 of a semiconductor wafer 101 for exposing a predetermined pattern on a region 103 of wafer 101. The predetermined pattern defines the configuration of a layer of material used to form electrical structures in region 103. Tool 10 senses the position of wafer 101 and the position of a reticle 111 and automatically adjusts their positions to align region 103 to reticle 111.

A light source 105 is activated to produce a light path 107 comprising optical waves at a deep ultraviolet or other specified wavelength. Light path 107 is directed through a focusing system, shown in the figure as a lens 109, to a reticle 111 containing clear and opaque regions formed in the predetermined pattern. Hence, reticle 111 functions as a photomask to screen out portions of light path 107 to transmit the predetermined pattern as a light path 13. In one embodiment, reticle 111 contains the predetermined pattern of one semiconductor die. In an alternate embodiment, reticle 111 can include shapes to form the predetermined pattern of a cluster of semiconductor dice in region 103. In order to accurately resolve small geometric features, the feature sizes of reticle 111 typically are four or five times the sizes to be printed on wafer 101.

Reticle 111 includes regions 121 and 123 containing shapes that function as alignment marks to align the predetermined pattern with patterns formed on wafer 101 during previous processing steps. A portion of light path 113 is transmitted through an optical sensor 125 to detect the position of the alignment marks in regions 121 and 123. Optical sensor 125 is configured to distinguish alignment marks from other patterns on reticle 111 by their respective shapes and orientations, as is known in the art. Optical sensor 125 produces a sense signal on node 141 indicative of the position of reticle 111. This sense signal is applied to a reticle position input of an alignment control circuit 151.

A lens 129 focuses light path 113 to produce a light path 114 focused in a region 103 of wafer 101 to expose a photoresist coating in the predetermined pattern. An optical sensor 131 operates in a similar fashion to optical sensor 125 but uses reflected light 147 from region 103 of surface 100 to detect the position of alignment marks in region 103. A representative sense signal is provided on a node 145 and applied to a wafer position input of alignment control circuit 151.

Alignment control circuit 151 receives information regarding the position of reticle 111 in the node 141 sense signal from sensor 125. Information regarding the position of region 103 of wafer 101 is received from sensor 131 in the node 145 sense signal. Alignment control circuit 151 processes these sense signals and provides a feedback signal on node 153 to drive a motor 155 that adjusts the position of a stage 157, and therefore of wafer 101. The adjustment continues until the alignment marks in region 103 are aligned with the alignment marks of reticle 111. In many alignment tools, the reticle and wafer stage are driven with separate motors to align to a stationary reference mark within the tool.

Region 103 defines a semiconductor die on which the predetermined pattern is formed in a single exposure by activating light source 105. Motor 155 has a stepping control input 159 for modifying the position of stage 157 in sequential steps to expose other regions of wafer 101 with similar patterns. Each of these regions is similarly aligned prior to activating light source 105. Hence each region includes its own alignment marks. When region 103 and the other regions each contain one semiconductor die, each of the dice on wafer 101 includes separate alignment marks. Alternatively, region 103 can include a cluster of semiconductor dice. Such a cluster is exposed at one time, and includes a single set of alignment keys for printing the predetermined pattern on all of the dice of the cluster. When all of the regions of surface 100 are printed, wafer 101 is removed for further processing.

FIG. 2 illustrates a portion of a semiconductor wafer 201 that uses prior art alignment marks. Wafer 201 includes a semiconductor die 203, illustrated by a dashed box, used in a semiconductor device such as an integrated circuit. Semiconductor die 203 includes an active region 205 containing electrical components for providing a circuit function, a first alignment region 207 that includes alignment marks 209, and a second alignment region 211 including alignment marks 213. Alignment marks 209 and 213 are detected in alignment tool 10 in order to align wafer 201, and are the same as those used on a Micrascan MSII model stepper alignment tool manufactured by the Silicon Valley Group.

A scribe grid 215 separates semiconductor die 203 from adjacent semiconductor dice on wafer 201. At the completion of wafer processing and testing, scribe grid 215 is scribed or sawed to singulate the dice of wafer 201 for subsequent packaging. To reduce the wafer area occupied by alignment regions 207 and 211, alignment regions 207 and 211 are included in scribe grid 215. Hence, when scribe grid 215 is sawed to singulate the dice of wafer 201, all or a portion of alignment regions 207 and 211 typically are sawed as well.

In accordance with the operation of alignment tool 10, the positions of alignment marks 209 and 213 are detected by optical sensor 131, and a representative sense signal is provided on node 145 of FIG. 1. Similar alignment marks on a reticle of the layer being aligned are detected by optical sensor 125 to produce a sense signal at node 141 to indicate the position of alignment marks on the reticle. The sense signals on nodes 141 and 145 are processed by alignment control circuit 151 to produce a control signal that causes motor 155 to adjust stage 157 in a direction that brings alignment marks 209 and 213 into alignment with corresponding alignment marks on the reticle.

Each alignment mark 209 comprises a pair of shapes angled at approximately forty-five degrees with respect to the sides of semiconductor die 203 and ninety degrees to each other. Similarly, each alignment mark 213 comprises a pair of shapes angled at approximately forty-five degrees with respect to the sides of semiconductor die 203 and ninety degrees from each other. However, alignment marks 209 have a different orientation from alignment marks 213, as shown in FIG. 2. That is, alignment marks 209 taper toward each other in one direction from active region 205, while alignment marks 213 taper toward each other in the opposite direction, so that alignment marks 209 and 213 are mirror images of each other. Optical sensor 131 distinguishes between alignment marks 209 and 213 by their different orientations. For accurate alignment, alignment marks with both orientations, i.e., tapering in opposite directions, are used.

Most processing steps such as etching or diffusion steps are performed in a batch mode. That is, the step is performed not only on a semiconductor die but also on the other semiconductor dice on the wafer. The cost of performing these processing steps is relatively constant for each wafer, so the cost for each semiconductor die is shared among all of the dice on a wafer. Hence, smaller semiconductor dice allow more dice to be formed on a wafer to share the fixed manufacturing cost, thereby reducing the manufacturing cost of each die.

The overall size of semiconductor die 203 is shown as the area inside of the dashed line in FIG. 2. This area includes the area of active region 205, alignment regions 207 and 211, and the portion of scribe grid 215 shown lying within the dashed line. The remainder portion of scribe grid 215, i.e., the portion outside of the dashed line, is attributed to the area of an adjacent die. Alignment regions 207 and 211 and scribe grid 215 are inactive regions of semiconductor die 203 in the sense that these regions are necessary to manufacture semiconductor die 203 but otherwise do not perform an active circuit function of a semiconductor device.

Scribe grid 215 has a typical width of at least one-hundred micrometers, which is added to the width of active region 205 to set the effective width of semiconductor die 203. Similarly, the heights of alignment regions 207 and 211 are one hundred ten micrometers each, or a total of two hundred twenty micrometers. Hence, two hundred twenty micrometers are added to the height of active region 205 to set the height of semiconductor die 203.

FIG. 3 illustrates a portion of semiconductor wafer 101 including region 103, which contains a single semiconductor die designated herein as semiconductor die 103 because no other die is formed in region 103. Semiconductor die 103 operates as an integrated circuit or other semiconductor device. Semiconductor die 103 includes an active region 161 containing electrical components for providing a circuit function. Active region 161 is surrounded by a scribe grid 191 that includes first and second alignment regions 163 and 169.

Note that first alignment region 163 includes alignment marks 165 and 167 which overlap to occupy the same area but are used to align different dice. Alignment marks 165 are used to align semiconductor die 103, while alignment marks 167 are used to align an adjacent semiconductor die 181 during a different exposure in alignment tool 10. Similarly, second alignment region 169 includes overlapping alignment marks 171 and 173. Alignment marks 171 are also used to align semiconductor die 103, but alignment marks 173 are used to align an adjacent semiconductor die 183 during a different exposure. Hence, alignment regions 163 and 169 include alignment marks which overlap in the same area but are used to align different semiconductor dice.

Alignment marks 165 have sizes and orientations in relation to active region 161 similar to prior art alignment marks 209, and alignment marks 171 have similar sizes and orientations as prior art alignment marks 213 as shown in FIG. 2. Similarly, alignment marks 173 are similar to alignment marks 209 and alignment marks 167 are similar to alignment marks 213. Alignment tool 10 can distinguish between alignment marks 165 and 167 because they have a mirror image orientation to each other. Alignment marks 171 and 173 can be distinguished because they have a mirror image orientation to each other as previously described. Hence, alignment marks for different dice which are printed in different exposures are overlapped to share the same alignment region of wafer 101.

The alignment scheme of the present invention can also be applied to multiple layers formed on semiconductor die 103 with different exposures. That is, where semiconductor die 103 has a first layer aligned with a first alignment mark disposed in alignment region 163, a second layer of die 103 can be aligned with a second alignment mark disposed in alignment region 163 during a later stage in the process. Die area can be reduced by disposing the second alignment mark to overlap the first alignment mark to reuse the same space of region 163.

Alignment tool 10 detects alignment marks 165 and 171 when aligning semiconductor die 103. Alignment marks 167 are detected when aligning semiconductor die 181 and alignment marks 173 are detected when aligning semiconductor die 183. In other words, when aligning semiconductor die 103, alignment tool 10 selects alignment marks 165 and 171 but rejects alignment marks 167 and 173. The die size and cost are reduced because the overlapping alignment marks eliminate the need for an extra alignment region as in the prior art. As a result, the present invention reduces the height of semiconductor die 103 by the height of one alignment region, or at least one hundred ten micrometers as compared to prior art alignment schemes. The reduced height proportionally reduces the effective die area, which allows more dice to be formed on wafer 101 to share the wafer manufacturing cost. The height of each die is reduced by a fixed amount, so the cost benefit is more significant for dice having smaller active regions.

In summary, the present invention provides a technique for reducing the die area and cost of a semiconductor device. A wafer includes a semiconductor die having a first alignment mark disposed in a region for aligning the die on the semiconductor wafer. A second die has a second alignment mark for aligning the second die. The second alignment mark is disposed to overlap the first alignment mark. The overlapping alignment marks allow the area occupied by the first and second alignment marks to be shared between adjacent dice, thereby reducing the cost of each die. Moreover, the advantages of the present invention can be obtained without modifying the existing manufacturing process or requiring additional processing steps or equipment.

What is claimed is:

1. A method of manufacturing semiconductor devices, comprising the steps of:

aligning a first semiconductor device on a semiconductor wafer with a first alignment mark; and aligning a second semiconductor device on the semiconductor wafer with a second alignment mark, wherein the second alignment mark is different than the first alignment mark and the second alignment mark intersects the first alignment mark.

2. The method of claim 1, further comprising the steps of:

forming a scribe grid on the semiconductor wafer between the first and second semiconductor devices; and forming the first alignment mark in a region of the scribe grid.

3. The method of claim 2, further comprising the step of disposing the second alignment mark in the region of the scribe grid.

4. The method of claim 2, wherein the step of forming the first alignment mark includes the step of forming the first alignment mark to have a first orientation on the semiconductor wafer.

5. The method of claim 4, wherein the step of forming the second alignment mark includes the step of forming the second alignment mark to have a second orientation on the semiconductor wafer that is different from the first orientation.

6. The method of claim 5, wherein the step of forming the second alignment mark includes the step of forming the second alignment mark as a mirror image of the first alignment mark.

7. The method of claim 1, further comprising the steps of:

coating the semiconductor wafer with a photoresist;

aligning the first semiconductor device in a stepper alignment tool; and activating a light path in the stepper alignment tool to expose the photoresist in a predetermined pattern to produce the first semiconductor device.

8. A method of manufacturing semiconductor devices, comprising the steps of:

using a first alignment mark on a semiconductor wafer for aligning during the formation of a first semiconductor device on the semiconductor wafer; and using a second alignment mark on the semiconductor wafer for aligning during the formation of a second semiconductor device on the semiconductor wafer, wherein the second alignment mark is different than the first alignment mark and a portion of the second alignment mark overlaps a portion of the first alignment mark.

9. A method of manufacturing semiconductor devices, comprising the steps of:

aligning a first semiconductor device on a semiconductor wafer with a first alignment mark, wherein the first alignment mark has a first orientation; and aligning a second semiconductor device on the semiconductor wafer with a second alignment mark, wherein the second alignment mark overlaps the first alignment mark and the second alignment mark has a second orientation that is different than the first orientation of the first alignment mark.

* * * * *